(12) United States Patent
Liang et al.

(10) Patent No.: US 7,988,110 B1
(45) Date of Patent: Aug. 2, 2011

(54) CABLE CLAMP

(75) Inventors: An-Gang Liang, Shenzhen (CN); Zheng-Heng Sun, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/881,140

(22) Filed: Sep. 13, 2010

(51) Int. Cl.
| | |
|---|---|
| A47B 96/00 | (2006.01) |
| A47K 1/00 | (2006.01) |
| A47K 5/00 | (2006.01) |
| E04G 5/06 | (2006.01) |
| F16L 3/08 | (2006.01) |
| F21V 21/00 | (2006.01) |
| F21V 35/00 | (2006.01) |
| E21F 17/02 | (2006.01) |
| F16L 3/12 | (2006.01) |

(52) U.S. Cl. ......... 248/221.11; 248/62; 248/222.11; 248/74.1; 248/74.2; 248/222.12

(58) Field of Classification Search ........... 248/221.11, 248/65, 62, 222.11, 64.1, 74.2, 74.1, 64.3, 248/222.12, 633
See application file for complete search history.

(56) References Cited

U.S. PATENT DOCUMENTS

| | | | | |
|---|---|---|---|---|
| 4,754,534 | A * | 7/1988 | Helwick | 24/543 |
| 5,226,892 | A * | 7/1993 | Boswell | 604/180 |
| 5,462,247 | A * | 10/1995 | Aldrich | 248/118 |
| 6,227,502 | B1 * | 5/2001 | Derman | 248/74.4 |
| 6,460,231 | B2 * | 10/2002 | Bourgerie | 24/487 |
| 7,546,986 | B2 * | 6/2009 | Kim | 248/62 |
| 7,708,235 | B2 * | 5/2010 | Hawkins | 248/74.2 |
| 2002/0007538 | A1 * | 1/2002 | Bourgerie | 24/517 |
| 2010/0108825 | A1 * | 5/2010 | Brock | 248/73 |
| 2010/0270439 | A1 * | 10/2010 | Li | 248/65 |

* cited by examiner

*Primary Examiner* — Terrell McKinnon
*Assistant Examiner* — Christopher Garft
(74) *Attorney, Agent, or Firm* — Zhigang Ma

(57) ABSTRACT

A cable clamp includes a base, a cover, a supporting plate, and a piece of foam secured to a top of the supporting plate. The cover includes a main body, a connection member and a fixing member extending from opposite ends of the main body. The connection member is fixed to a first end of the base. A latch is formed on a second end of the base to engage with the fixing member of the cover, the supporting plate is slidably installed to a top of the base.

6 Claims, 4 Drawing Sheets

CABLE CLAMP

CROSS-REFERENCE OF RELATED APPLICATIONS

Relevant subject matter is disclosed in a co-pending U.S. patent application, titled "CABLE CLAMP", with the application Ser. No. 12/878,004, which is assigned to the same assignee as this patent application.

BACKGROUND

1. Technical Field

The present disclosure relates to a cable clamp.

2. Description of Related Art

Cable clamps are generally used to bind cables used in computer systems. If clamping spaces of the cable clamps are not full with cables, airflow will get through the interspaces of the cable clamps, and change airflow in the computer systems.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
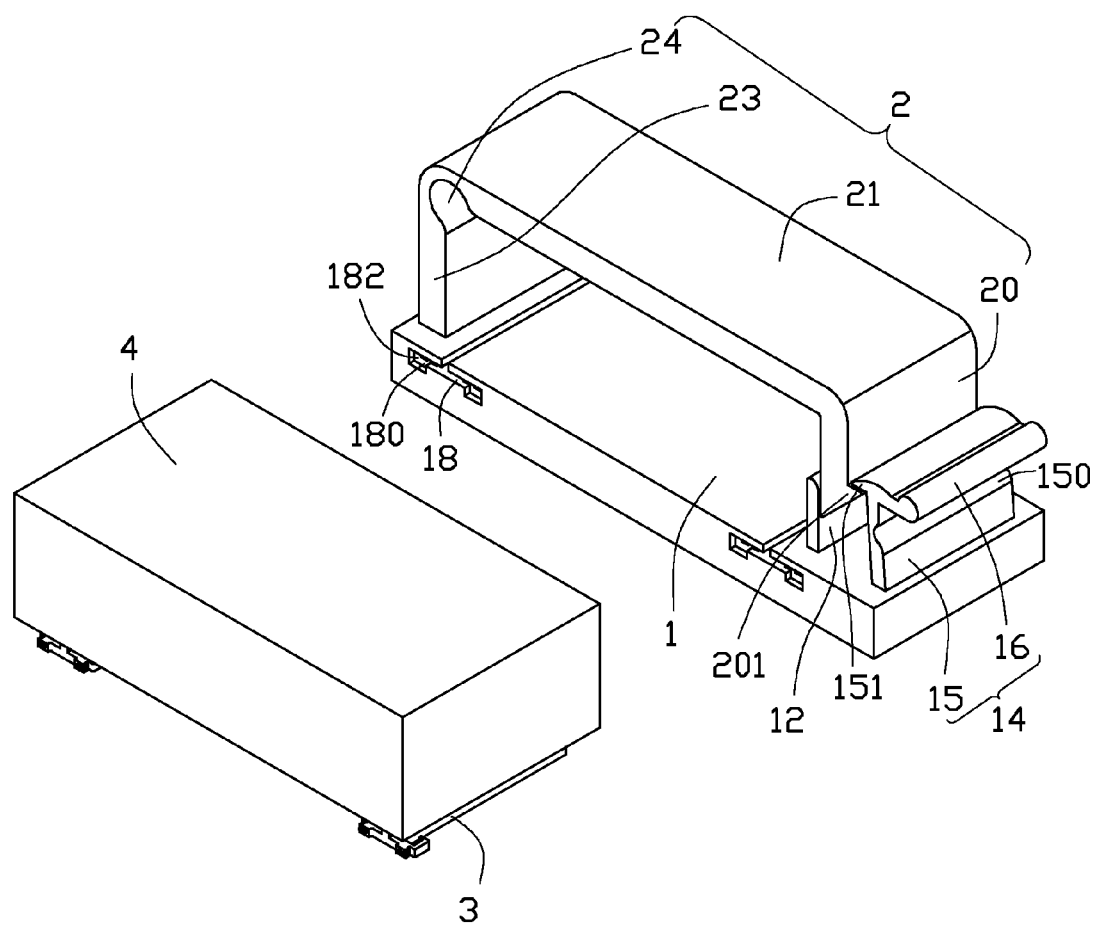
FIG. 1 is an exploded, isometric view of an exemplary embodiment of a cable clamp; the cable clamp includes a supporting member.
Figure 2:
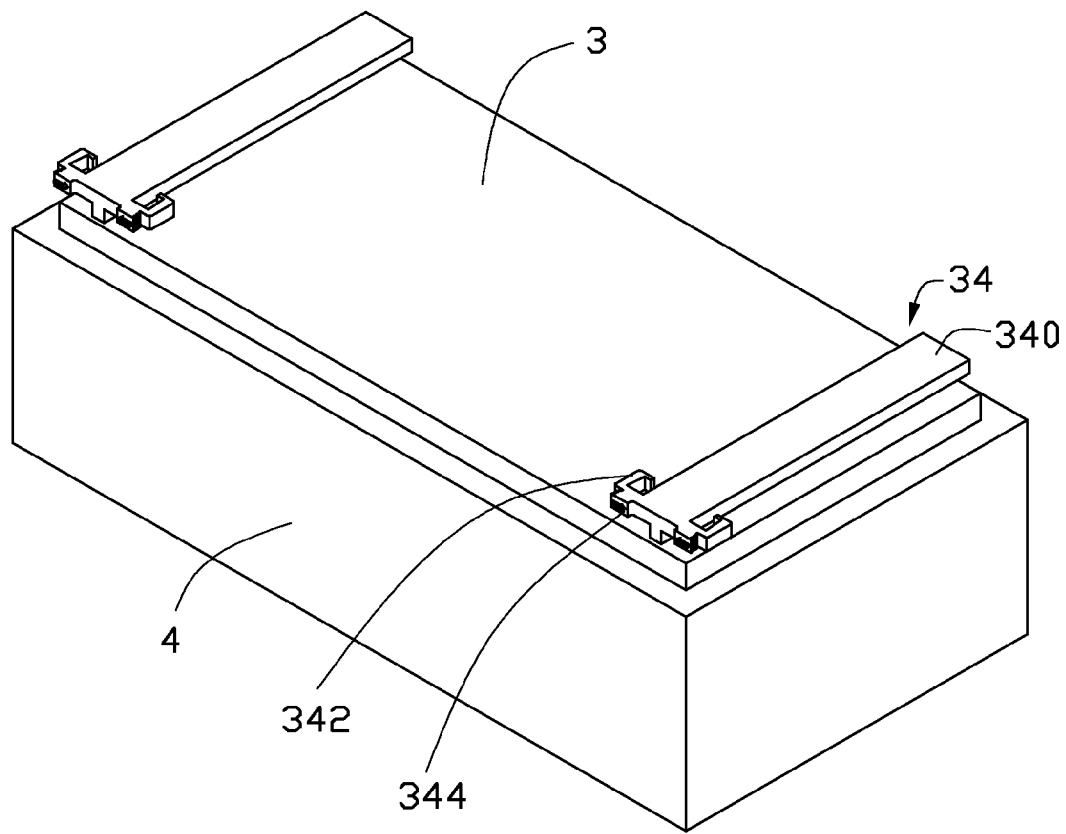
FIG. 2 is an isometric, inverted view of the supporting member of FIG. 1.

Referring to FIG. 1 and FIG. 2, an exemplary embodiment of a cable clamp includes a base 1, a cover 2 installed on the base 1, a supporting plate 3, and a piece of foam 4 secured to the supporting plate 3.

A limiting piece 12 and a latch 14 perpendicularly extend up from a first end of the base 1. The limiting piece 12 is located at a side of the latch 14 away from the first end of the base 1. The latch 14 is T-shaped, and includes a holding portion 15 perpendicularly extending from a top surface of the base 1. An operation portion 16 and a first engaging portion 151 perpendicularly extend in opposite directions from a distal end of the holding portion 15, the first engaging portion 151 extending toward the limiting piece 12. A slot 150 is defined in the holding portion 15, opposite to the limiting piece 12 and between the operation portion 16 and the base 1. Two slots 18 are defined in the base 1, between a second end and the limiting piece 12 of the base 1 and extending through two opposite sides of the base 1. A cross-section of each of the slots 18 is generally T-shaped. Two substantially U-shaped engaging slots 182 are defined in one of the sides of the base 1, at opposite sides of each slot 18, with a blocking portion 180 formed in each engaging slot 182.

The cover 2 includes a flat main body 21, and a fixing member 20 and a connection member 23 perpendicularly extending down from opposite ends of the main body 21. A substantially wedge-shaped second engaging portion 201 extends from a distal end of the fixing member 20, away from the connection member 23. The connection member 23 is fixed to the second end of the base 1. A slot 24 is defined in a junction of the main body 21 and the connection member 23 so that the main body 21 together with the fixing member 20 can rotate about the junction.

Two substantially T-shaped installation members 34 extend from opposite ends of a bottom of the supporting plate 3. Each installation member 34 includes an inserting piece 340 parallel to the supporting plate 3. Two elastic hooks 342 extend from opposite sides of a first end of the inserting piece 340. An operation portion 344 is formed on each of the hooks 342, away from a second end of the inserting piece 340 opposite to the first end.

Figure 3:
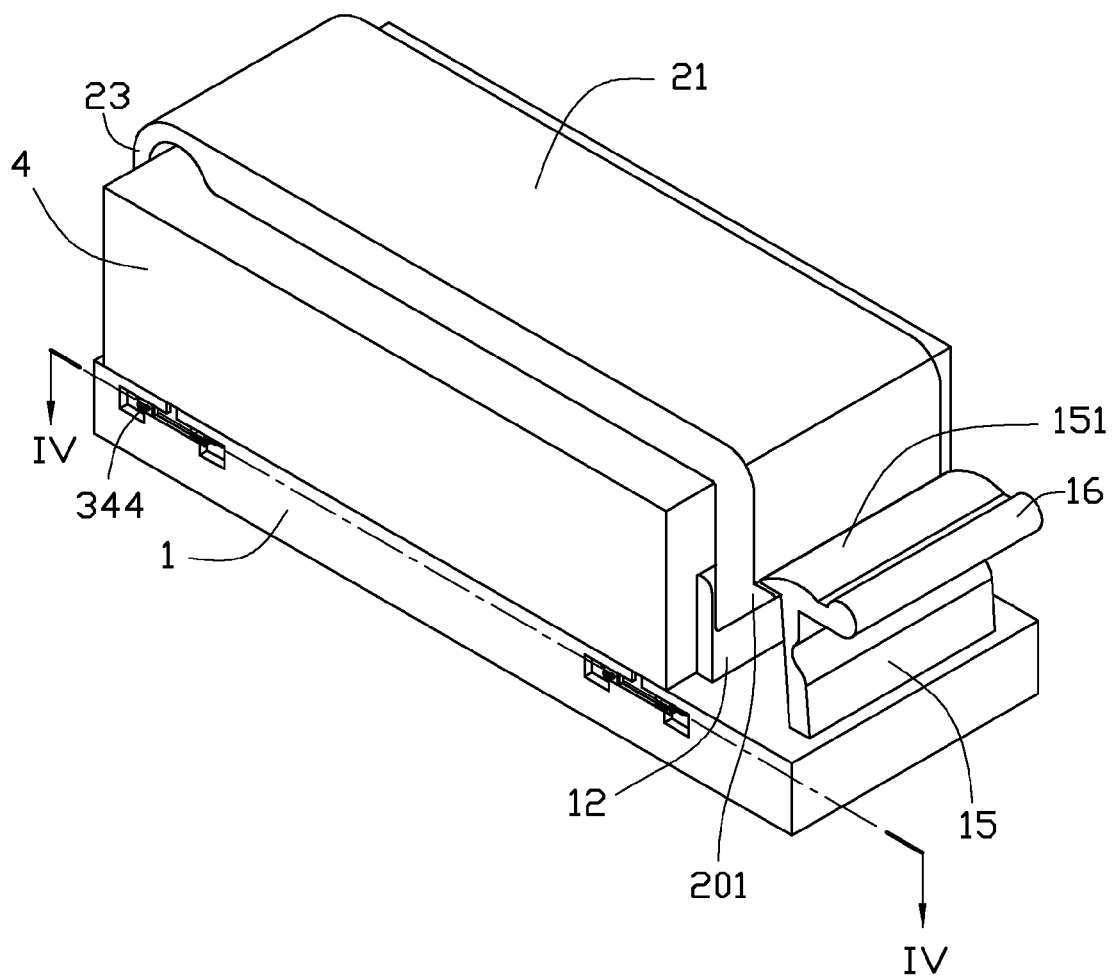
FIG. 3 is an assembled, isometric view of the cable clamp of FIG. 1.
Figure 4:
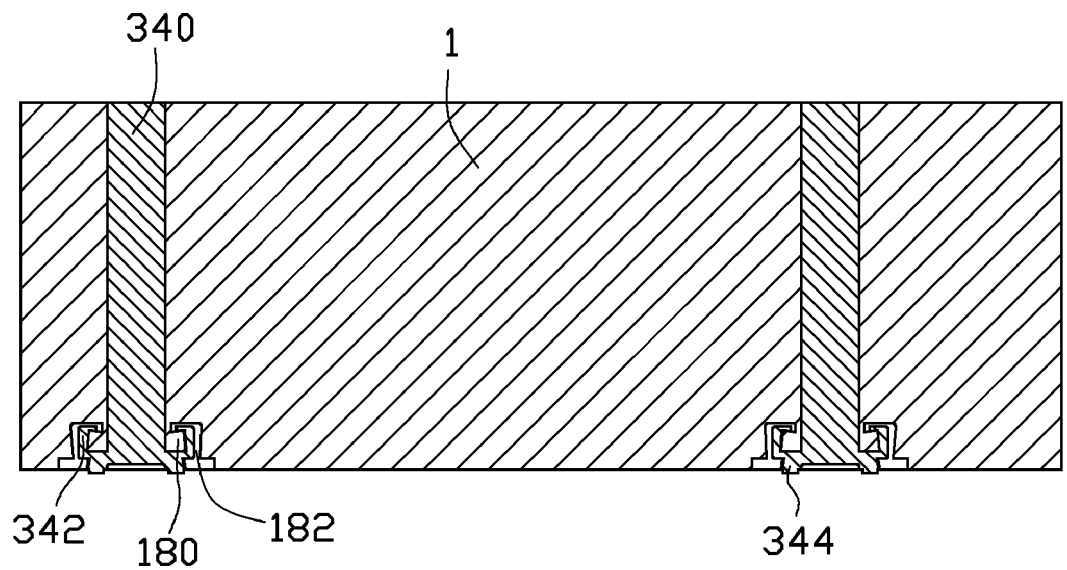
FIG. 4 is an assembled, sectional view taken along the line IV-IV of FIG. 3.

Referring to FIG. 3 and FIG. 4, in use, when the cable clamp 1 cannot be entirely filled with cables, the piece of foam 4 is installed between the base 1 and the cover 2. The installation members 34 of the supporting plate 3 extend into the corresponding slots 18 of the base 1, with the hooks 342 inserted in the corresponding slots 182. Then the operation portions 344 of each of the hooks 342 are pressed toward each other to deform the hooks 342 to pass by the corresponding blocking portions 180.

Then the hooks 342 are released to rebound and engage with the blocking portions 180 in the corresponding engaging slots 182. Therefore the piece of foam 4 is installed on the base 1 and located between the limiting piece 12 of the base 1 and the connection member 23 of the cover 2.

The main body 21 together with the fixing member 20 is rotated about the junction of the main body 21 and the connection member 23, with the fixing member 20 disengaged from the latch 14. Cables then may be put on the piece of foam 4, then the main body 21 of the cover 2 is rotated toward the base 1, until the fixing member 20 of the cover 2 is inserted into the space between the limiting piece 12 and the holding portion 15, with the second engaging portion 201 of the fixing member 20 engaging with the first engaging portion 151 of the base 1. Thus the cables are located between the piece of foam 4 and the cover 2 and no airways are defined that would allow unwanted airflow.

In disassembling the piece of foam 4 from the base 1, the operation portion 16 is pressed toward the base 1 to rotate the holding portion 15 about the slot 150, so that the first engaging portion 151 disengages from the second engaging portion 201.

Then, the main body 21 of the cover 2 is rotated away from the base 1 about the junction of the main body 21 and the connection member 23, and the operation portions 344 of each installation member 34 of the supporting plate 3 is pressed toward each other, so that the hooks 342 are deformed and disengage from the corresponding blocking portions 180. Therefore, the installation members 34 of the supporting plate 3 are readily removed from the corresponding slots 18 of the base 1.

In other embodiments, the shape of the piece of foam 4 can be changed to fit the shapes of different cables.

It is believed that the present embodiments and their advantages will be understood from the foregoing description, and they will be apparent that various changes may be made thereto without departing from the spirit and scope of the description or sacrificing all of their material advantages, the examples hereinbefore described merely being exemplary embodiment.

What is claimed is:

1. A cable clamp, comprising:

a base comprising a latch extending from a first end of the base;

a cover comprising a main body opposite to the base, a connection member extending from a first end of the main body and fixed to a second end of the base opposite to the first end, and a fixing member extending from a second end of the main body to detachably engage with the first end of the base by the latch;

a supporting plate selectively installed to or uninstalled from the base; and a piece of foam secured on the supporting plate;

wherein the piece of foam is located between the base and the main body of the cover in response to the supporting plate being installed to the base, the base defines two slots in the first and second ends of the base, respectively, two installation members extend from opposite ends of the supporting plate, opposite to the piece of foam, each of the installation members comprises an inserting portion corresponding to one of the slots of the base, cross-sections of both the inserting portions and the slots are substantially T-shaped, two engaging slots are defined in the base at opposite sides of an end of each slot, a blocking portion is formed in each engaging slot, two substantially U-shaped hooks extend from opposite sides of a first end of each inserting portion, to extend in the corresponding engaging slots and engage with the corresponding blocking portions in the engaging slots.

2. The cable clamp of claim 1, wherein an operation portion extends from a side of each hook away from a second end of the inserting portion, is operated to deform the hook to disengage from the blocking portion of the corresponding engaging slot.

3. The cable clamp of claim 1, wherein a limiting piece substantially perpendicularly extends from the base between the latch and the slot in the second end of the base, the slots are located between the connection member of the cover and the limiting piece, the piece of foam locates between the connection member of the cover and the limiting piece in response to the supporting plate being installed to the base.

4. The cable clamp of claim 3, wherein the latch comprises a holding portion perpendicularly extending from the base, an operation portion and a first engaging portion perpendicularly extend in opposite directions from a distal end of the holding portion, a second engaging portion extends from a distal end of the fixing member, away from the connection member of the cover, the fixing member of the cover is operable to be inserted into a space between the limiting piece and the holding portion, thereby the second engaging portion engages with the first engaging portion.

5. The cable clamp of claim 4, wherein a slot is defined in the holding portion between the base and the operation portion, thereby the holding portion is rotatable about the slot by operating the operation portion to disengage the second engaging portion from the first engaging portion.

6. The cable clamp of claim 1, wherein a slot is defined in a conjunction of the main body and the connection member, thereby the main body is rotatable about the connection member via the slot.

* * * * *